(12) United States Patent
Zhang

(10) Patent No.: US 10,268,071 B2
(45) Date of Patent: Apr. 23, 2019

(54) LIGHT GUIDE PLATE AND BACKLIGHT MODULE HAVING THE SAME AND LIQUID CRYSTAL DISPLAY

(71) Applicants: Shenzhen China Star Optoelectronics Technology Co., Ltd., Guangdong (CN); Wuhan China Star Optoelectronics Technology Co., Ltd., Wuhan, Hubei (CN)

(72) Inventor: Yanxue Zhang, Guangdong (CN)

(73) Assignees: Shenzhen China Star Optoelectronics Technology Co., Ltd., Shenzhen, Guangdong (CN); Wuhan China Star Optoelectronics Technology Co., Ltd., Wuhan, Hubei (CN)

( * ) Notice: Subject to any disclaimer, the term of this patent is extended or adjusted under 35 U.S.C. 154(b) by 459 days.

(21) Appl. No.: 14/787,578

(22) PCT Filed: Jun. 3, 2015

(86) PCT No.: PCT/CN2015/080678
§ 371 (c)(1),
(2) Date: Oct. 28, 2015

(87) PCT Pub. No.: WO2016/155115
PCT Pub. Date: Oct. 6, 2016

(65) Prior Publication Data
US 2018/0004038 A1    Jan. 4, 2018

(30) Foreign Application Priority Data

Mar. 27, 2015 (CN) .......................... 2015 1 0140362

(51) Int. Cl.
*G02F 1/1335* (2006.01)
*G02B 6/00* (2006.01)
*F21V 8/00* (2006.01)

(52) U.S. Cl.
CPC ......... *G02F 1/133603* (2013.01); *G02B 6/00* (2013.01); *G02B 6/0025* (2013.01);
(Continued)

(58) Field of Classification Search
CPC .... F21K 9/64; F21Y 2103/10; F21Y 2105/10; G02B 6/0011; G02B 6/0013;
(Continued)

(56) References Cited

U.S. PATENT DOCUMENTS 7,046,907 B2    5/2006  Miyashita
8,573,827 B2   11/2013  Lee
(Continued)

FOREIGN PATENT DOCUMENTS

CN    1655032    8/2005
CN    1896831    1/2007
(Continued)

OTHER PUBLICATIONS

International Search Report for PCT/CN2015/080678, English translation attached to original, Both completed by the Chinese Patent Office on Nov. 26, 2015, All together 6 Pages.

*Primary Examiner* — Hargobind S Sawhney
(74) *Attorney, Agent, or Firm* — Mintz Levin Cohn Ferris Glovsky and Popeo, P.C.; Kongsik Kim; Jhongwoo Jay Peck

(57) ABSTRACT

A light guide plate which includes a light incident surface, a light conversion element, an accommodation through hole and a diffusion element, the accommodation through hole is formed in the light guide plate and is adjacent to the light incident surface, the light conversion element is accommodated in the accommodation through hole, and the diffusion element is disposed on the light incident surface. Also disclosed is a light having a backlight module and a liquid crystal display having the light guide plate. A light conver- (Continued)

sion element is accommodated in the light guide plate, so as to avoid over-heating the light conversion element to further avoid reducing the color gamut of the product.

18 Claims, 3 Drawing Sheets

(52) U.S. Cl.
CPC .. *G02F 1/133504* (2013.01); *G02F 1/133524* (2013.01); *G02F 1/133606* (2013.01); *G02F 1/133615* (2013.01)

(58) Field of Classification Search
CPC .. G02B 6/0016; G02B 6/0023; G02B 6/0025; G02B 6/0026; G02B 6/0041; G02B 6/0066; G02F 1/133602; G02F 1/133603; G02F 1/133504; G02F 1/133615; G02F 1/133617
See application file for complete search history.

(56) References Cited

U.S. PATENT DOCUMENTS

| | | | |
|---|---|---|---|
| 9,103,954 B2* | 8/2015 | Asano | C03B 23/245 |
| 9,268,080 B2* | 2/2016 | Lee | G02B 6/0011 |
| 9,568,664 B2* | 2/2017 | Cho | G02B 6/0065 |
| 2006/0256254 A1* | 11/2006 | Park | G02B 6/002 349/65 |
| 2008/0084706 A1* | 4/2008 | Roshan | B82Y 20/00 362/601 |
| 2009/0009687 A1* | 1/2009 | Park | G02B 5/0215 349/64 |
| 2011/0181809 A1 | 7/2011 | Sekiguchi et al. | |
| 2011/0273644 A1* | 11/2011 | Yamahara | G02B 5/02 349/64 |
| 2012/0120678 A1* | 5/2012 | Su | G02B 6/0025 362/607 |
| 2013/0128614 A1* | 5/2013 | Lee | G02B 6/0023 362/609 |
| 2014/0022779 A1* | 1/2014 | Su | H01L 33/504 362/231 |
| 2014/0355250 A1* | 12/2014 | Tyan | G02B 5/0226 362/97.1 |

FOREIGN PATENT DOCUMENTS

| | | |
|---|---|---|
| CN | 102537791 | 7/2012 |
| CN | 102628580 | 8/2012 |
| CN | 103047616 | 4/2013 |

* cited by examiner

LIGHT GUIDE PLATE AND BACKLIGHT MODULE HAVING THE SAME AND LIQUID CRYSTAL DISPLAY

CROSS-REFERENCE TO RELATED APPLICATION

This application is the U.S. national phase of PCT Application No. PCT/CN2015/080678 filed on Jun. 3, 2015, which claims priority to CN Patent Application No. 201510140362.5 filed on Mar. 27, 2015, the disclosures of which are incorporated in their entirety by reference herein.

TECHNICAL FIELD

The present invention belongs to a technical field of a liquid crystal display, and specifically relates to a light guide plate, a backlight module having the light guide plate and a liquid crystal display.

BACKGROUND ART

In the existing liquid crystal display (LCD), a white light emitting diode (LED) is usually used as a backlight source, and the backlight required by a liquid crystal display panel is achieved by reasonably collocating the light guide plate and an optical film. As requirements for high color gamut, high color saturation and energy-saving by the people are higher and higher, solutions of implementing the white light source, high color gamut and high color saturation in the current backlight include: using a UV-LED cooperated with red, green and blue (RGB) fluorescent powder; using a blue LED cooperated with red and green (RG) fluorescent powder; using a blue LED cooperated with a green LED and a red LED and so on. These solutions all can improve the color gamut, while implementing them is harder, and costs are higher.

A Quantum Dot (QD) technology is a semiconductor nanomaterial structure technology to bound electrons in a certain range, and the QD is formed of super-small compound crystal having sizes in a range of 1-100 nm. In the QD technology, wavelengths of lights can be controlled by using the crystal having different sizes, so as to accurately control colors of the lights. Thus, QD materials are applied in the backlight module. A high-frequency spectrum light source is adopted (such as the blue LED) to replace a traditional white light LED light sources, under the irradiation of the high-frequency spectrum light source, the QD materials can be excited to generate lights of different wavelengths. The colors of synthetic lights can be regulated by adjusting the sizes of the QD materials, such that the backlight requirement of the liquid crystal display of the high color gamut can be achieved.

FIG. 1 is a backlight module using a QD glass tube in the existing conventional technology. Referring to FIG. 1, a blue LED 11 is disposed right opposite to a light incident surface 121 of a light guide plate 12, QD fluorescent powder is encapsulated in the glass tube to form a QD glass tube 13, wherein the QD glass tube 13 is disposed between the blue LED 11 and the light incident surface 121 of the light guide plate 12. Blue lights emitted from the blue light LED 11 are irradiated to the light incident surface 121 of the light guide plate 12 through the QD glass tube 13. However, since the QD fluorescent power is very sensitive to a temperature, when a method shown in FIG. 1 is adopted, the QD fluorescent powder suffers large heat, thereby reducing the color gamut of a product.

SUMMARY

In order to solve the problem existing in the prior art, an aspect of the present invention is to provide a light guide plate which include a light incident surface and a light conversion element, the light convention elements is accommodated in the light guide plate, and is adjacent to the light incident surface.

Furthermore, the light guide plate includes an accommodation through hole that is adjacent to the light incident surface, and the light conversion element is accommodated in the accommodation through hole.

Furthermore, the light conversion element includes a transparent case and a plurality of light conversion particles, and the plurality of light conversion particles are encapsulated in the transparent case.

Furthermore, the light conversion element includes a transparent gel and a plurality of light conversion particles, and the plurality of light conversion particles are mixed in the transparent gel.

Furthermore, the light conversion particles are Quantum Dots fluorescent powders.

Furthermore, the light guide plate further includes a diffusion element/diffuser, and the diffusion element/diffuser is disposed on the light incident surface.

Furthermore, the diffusion element includes a plurality of diffusion particles and another transparent gel, and the plurality of diffusion particles are mixed in the another transparent gel.

Furthermore, the light guide plate further includes a plurality of diffusion particles, and the plurality of diffusion particles are mixed in the transparent gel.

Another aspect of the present invention is also to provide a backlight module which includes the above light guide plate and at least one light source, wherein the light source is placed facing the light incident surface of the light guide plate.

A further aspect of the present invention is to provide a liquid crystal display which includes the above backlight module and the liquid crystal display panel disposed opposite to the backlight module, the backlight module provides a display light source to the liquid crystal panel so that the liquid crystal display panel displays an image.

In the present invention, the light conversion element is accommodated in the light guide plate, so as to prevent the light conversion element from suffering too much heat to avoid reducing the color gamut of the product.

BRIEF DESCRIPTION OF THE DRAWINGS

These and/or other aspects, characteristics and advantages of the embodiments in the invention will become apparent and more readily appreciated from the following description, taken in conjunction with the accompanying drawings in which.

DETAILED DESCRIPTION OF EMBODIMENTS

Embodiments of the present invention will be described in detail below by referring to the accompany drawings. However, the present invention can be implemented in numerous different forms, and the present invention may not be explained to be limited hereto. Instead, these embodiments are provided for explaining the principle and actual application of the present invention, thus other skilled in the art can understand various embodiments and amendments which are suitable for specific intended applications of the present invention. In the FIGURES, in order to see the devices clearly, thicknesses of a layer and an area may be exaggerated, the same reference number in the whole description and figures can be used to denote the same elements.

Figure 1:
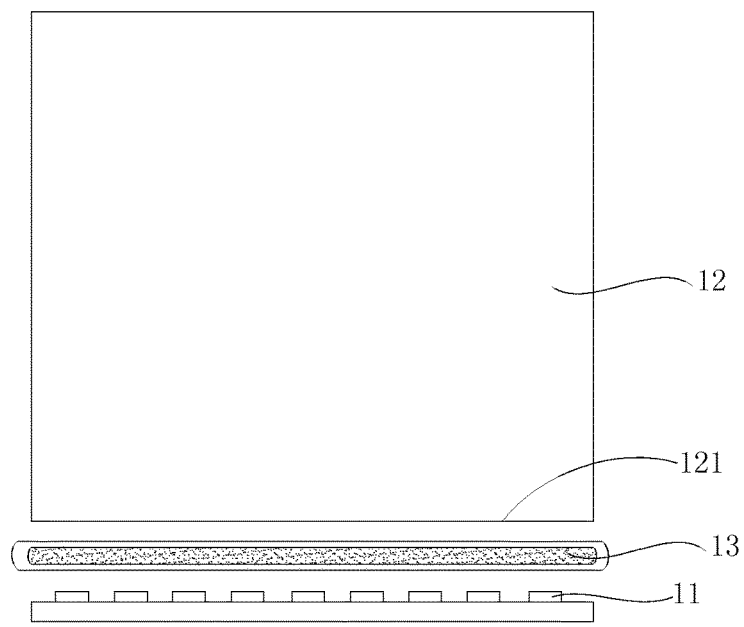
FIG. 1 is a backlight module using a QD glass tube in the existing conventional technology.
Figure 2:
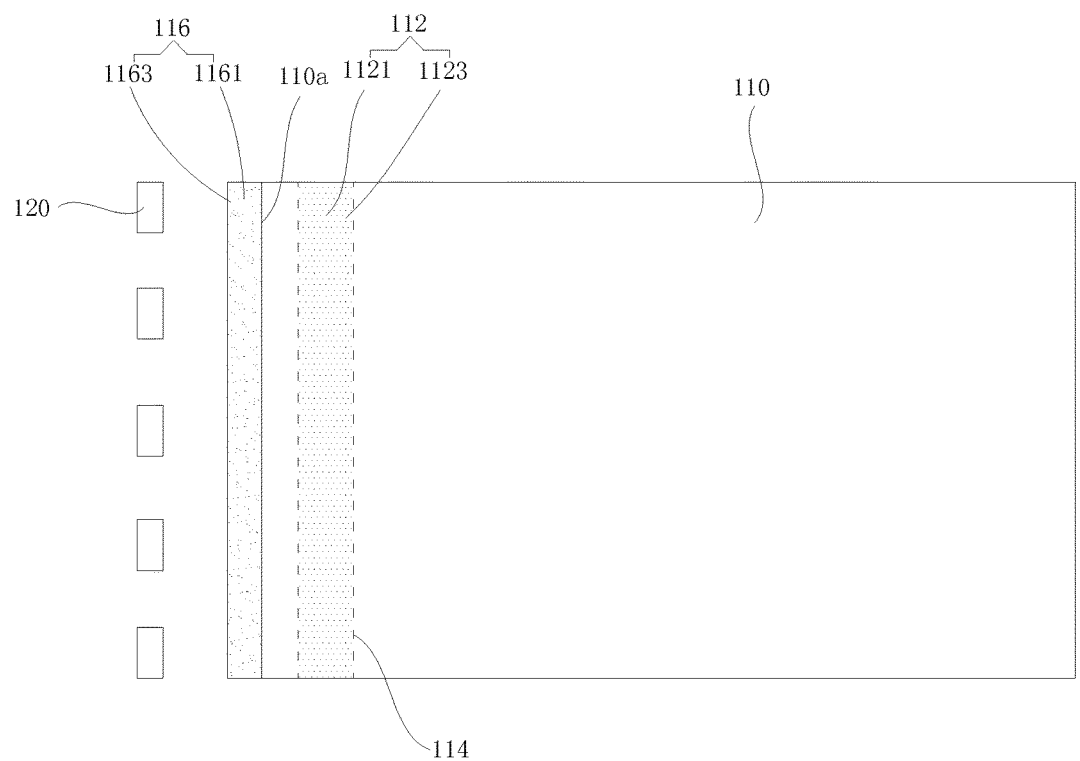
FIG. 2 is a top perspective view of a backlight module according to an embodiment of the present invention.
Figure 3:
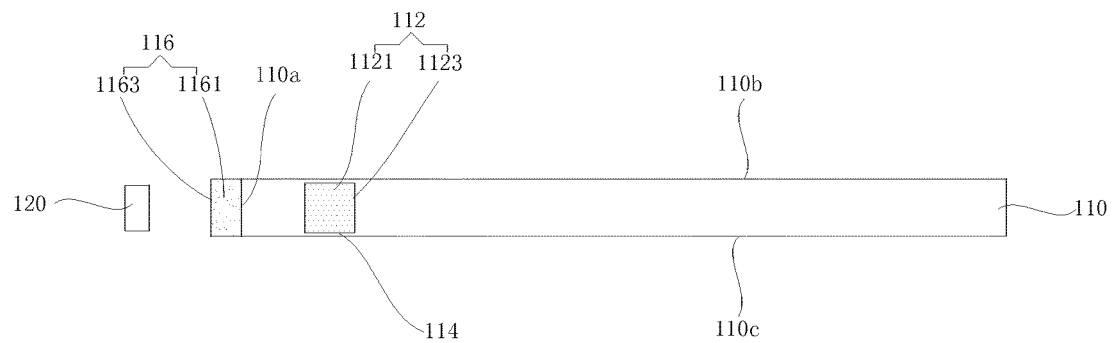
FIG. 3 is a side view according to a backlight module according to an embodiment of the present invention.

FIG. 2 is a top perspective view of a backlight module according to an embodiment of the present invention; FIG. 3 is a side view of a backlight module according to an embodiment of the present invention;

Referring to FIGS. 2 and 3, a backlight module 100 according to the embodiment of the present invention includes a light guide plate 110 and at least one light source 120. Each light source 120 is disposed in a manner that the light emitting surface thereof facing the light guide plate 110. It should be explained that, the backlight module 100 according to the embodiment of the present invention further includes other necessary optical parts such as a backlight plate and an optical film etc., please refer to the depictions of the prior art for details, which is not repeated here.

A light guide plate 110 has a light incident surface 110a, and includes a light conversion element 112. In the present embodiment, the light guide plate 110 can be a flat plate type light guide plate, but the present invention is not limited thereto, and the light guide plate 110 also can be a wedge-shaped light guide plate.

In the present embodiment, the light guide plate 110 can have opposite first surface 110b and second surface 110c, that is, an upper surface and a lower surface of the light guide plate 110 shown in FIG. 3.

In the present embodiment, a backlight module 100 can be a side-incident type backlight module, but the present invention is not limited thereto, and the backlight module 100 also can be a direct type backlight module.

Take the side-incident type backlight module as an example, the light incident surface 110a is for example a side surface connecting the first surface 110b and the second surface 110c of the light guide plate 110, while the first surface 110b of the light guide plate 110 is an light exiting surface. At this time, a light source 120 is configured facing the light incident surface 110a of the light guide plate 110.

The light conversion element 112 is accommodated in the light guide plate 110, and is adjacent to the light incident surface 110a of the light guide plate 110.

In the present embodiment, each light source 120 is for example a LED packaging structure, which has a light emitting surface facing the light incident surface 110a. Light rays provided by the light source 120 are emitted from the light emitting surface thereof. Thus, the light source 120 emits lights to the light guide plate 110, and the lights are incident to the light conversion element 112 accommodated in the light guide plate 110 through the light incident surface 110a, and then are exited from the light exiting surface (i.e., the first surface 110b) of the light guide plate 110, so as to form a surface light source.

The light conversion element 112 converts an initial wavelength of the incident light to the other wavelength.

In the present embodiment, the light guide plate 110 has an accommodation through hole 114. A central axis direction of the accommodation through hole 114 is parallel to a length direction of the light incident surface 110a. The accommodation through hole 114 is adjacent to the light incident surface 110a. The light conversion element 112 is accommodated in the accommodation through hole 114.

As an implementing method, referring to FIGS. 2 and 3, the light conversion element 112 includes light conversion particles 1121. The light conversion particles 1121 can be mixed in a light transmission gel 1123, to form a mixed gel. And then the mixed gel is filled in the accommodation through hole 114 of the light guide plate 110. After the mixed gel in the accommodation through hole 114 is cured, the light conversion element 112 is formed in the accommodation through hole 114 of the light guide plate 110.

The light transmission gel 1123 can be a UV (Ultraviolet) adhesive or a thermosetting adhesive. The UV adhesive includes, for example, a optical SVR (Super View Resin) adhesive and an optical liquid adhesive. The thermosetting adhesive includes, for example, optical epoxy glue or a silicon gel. The light conversion particles 1121 are, for example, QD fluorescent powders.

Figure 4:
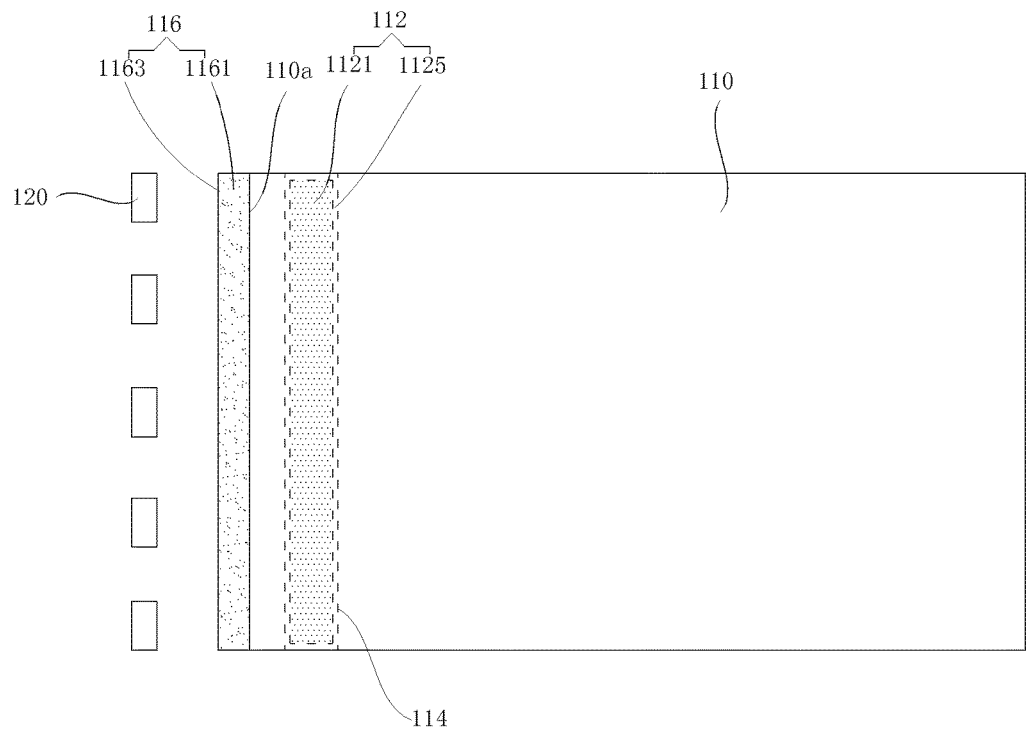
FIG. 4 is a side view of a backlight module according to another embodiment of the present invention.

As another implementation, referring to FIG. 4, the light conversion element 112 includes light conversion particles 1121. The light conversion particles 1121 are encapsulated in a transparent case (such as a transparent glass tube) 1125, to form a light conversion element 112. And then the formed light conversion element 112 is accommodated in the accommodation through hole 114 of the light guide plate 110. The light conversion particles 1121 are, for example, QD fluorescent powders.

In order to emit white lights, a blue LED packaging structure can be selected as light source 120, while materials of the light conversion particles 1121 may adopt QD fluorescent powders that emit yellow lights. When blue lights emitted from a portion of blue light LED packaging structures are projected to the light conversion element 112, yellow lights may be exited from the QD fluorescent powders that emit the yellow lights in the light conversion element 112. The excited yellow lights are mixed with the blue lights emitted from the light source 120 to form white lights.

A content of the light conversion particles 1121 can be determined according to a type of the light source 120, a shape of the light conversion element 112 and/or efficiency required by the backlight module 100.

In addition, referring to FIGS. 2, 3 and 4, the light guide plate according to the embodiment of the present invention further includes a diffusion element/diffuser 116, wherein the diffusion element 116 is disposed on the light incident surface 110a.

The diffusion element 116 includes a plurality of diffusion particles 1161. Plurality of the diffusion particles 1161 can be mixed in another light transmission gel 1163, to form another mixed gel. And then the mixed gel is coated on the light incident surface 110a of the light guide plate 110. After the another mixed gel on the light incident surface 110a is cured, the diffusion element 116 is formed in the light incident surface 110a of the light guide plate 110.

A refractive index of these diffusion particles 1161 is different from that of the another light transmission gel 1163, so that the light rays provided by the light source 120 will be scattered by these diffusion particles 1161 after they enter into the diffusion element 116, thereby producing the required scattering effect. For example, the refractive index of the diffusion particles 1161 is, e.g., about 1.49 or 1.57, and sizes thereof are about 3-15 μm. Hereof, the refractive index of another light transmission gel 1163 is, e.g., about 1.52.

As another embodiment, these diffusion particles 1161 can be mixed in the light transmission gel 1123 when forming the light conversion element 112 as shown in FIGS. 2 and 3, to form the diffusion element 116.

Figure 5:
FIG. 5 is a structural schematic diagram of a liquid crystal display according to the present invention.

FIG. 5 is a structural schematic diagram of a liquid crystal display according to the present invention.

Referring to FIG. 5, the liquid crystal display according to the present invention includes a liquid crystal display panel 200 and a backlight module 100 which is shown in FIG. 2 or FIG. 3 or FIG. 4 and disposed opposite to the liquid crystal display panel 200, wherein the backlight module 100 provides a display light source to the liquid crystal display panel 200, so that the liquid crystal display panel 200 displays an image.

The liquid crystal display panel 200 usually includes a Thin Film Transistor (TFT) array substrate 210, a Color Filter (CF) substrate 220 disposed opposite to the TFT array substrate, and a liquid crystal layer 230 disposed between the TFT array substrate 210 and the CF substrate 220, wherein the liquid crystal layer 230 includes a plurality of liquid crystal molecules. Since the specific structure of the liquid crystal display panel 200 of the present invention is basically consistent with the structure of the liquid crystal display panel of the prior art, it will not be repeated here specifically.

In conclusion, according to the embodiments of the present invention, the light conversion element is accommodated in the light guide plate, so as to avoid over-heating of the light conversion element, such that avoid reducing the color gamut of the product.

Although the present invention is described with reference to the special embodiments, while those skilled in the art will understand: various changes in form and details may be made therein without departing from the spirit and scope of the invention as defined by the appended claims and its equivalents.

The invention claimed is:

1. A light guide plate, comprising:
a light incident surface formed at a proximal side surface of the light guide plate,
an accommodation through hole formed in the light guide plate proximate to the light incident surface, wherein the accommodation through hole has a substantially square cross-section and penetrates from a right side surface of the light guide plate to a left side surface of the light guide plate, and all longitudinal side surfaces thereof are enclosed by the light guide plate;
a light conversion element disposed within the accommodation through hole; and
a diffusion element disposed on the light incident surface to scatter light rays.

2. The light guide plate of claim 1, wherein the light conversion element comprises a transparent case and a plurality of Quantum Dots (QDs), and the plurality of QDs are encapsulated in the transparent case.

3. The light guide plate of claim 1, wherein the light conversion element comprises a transparent gel and a plurality of Quantum Dots (QDs), and the plurality of QDs are mixed in the transparent gel.

4. The light guide plate of claim 3, wherein the light guide plate further comprises a plurality of diffusion particles, and the plurality of diffusion particles are mixed in the transparent gel.

5. The light guide plate of claim 1, wherein the diffusion element comprises a plurality of diffusion particles and another transparent gel, and the plurality of diffusion particles are mixed in the another transparent gel.

6. The light guide plate of claim 5, wherein a refractive index of the plurality of diffusion particles is different from a refractive index of the another transmission gel.

7. A backlight module comprising:
at least one light source; and
a light guide plate comprising:
a light incident surface formed at a proximal side surface of the light guide plate,
an accommodation through hole formed in the light guide plate proximate to the light incident surface, wherein the accommodation through hole has a substantially square cross-section and penetrates from a right side surface of the light guide plate to a left side surface of the light guide plate, and all longitudinal side surfaces thereof are enclosed by the light guide plate;
a light conversion element disposed within the accommodation through hole; and
a diffusion element disposed on the light incident surface to scatter light rays,
wherein the light sources is placed facing the light incident surface of the light guide plate.

8. The backlight module of claim 7, wherein the light conversion element comprises a transparent case and a plurality of Quantum Dots (QDs), and the plurality of QDs are encapsulated in the transparent case.

9. The backlight module of claim 7, wherein the light conversion element comprises a transparent gel and a plurality of Quantum Dots (QDs), and the plurality of QDs are mixed in the transparent gel.

10. The backlight module of claim 9, wherein the light guide plate further comprises a plurality of diffusion particles, and the plurality of diffusion particles are mixed in the transparent gel.

11. The backlight module of claim 7, wherein the diffusion element comprises a plurality of diffusion particles and another transparent gel, and the plurality of diffusion particles are mixed in the another transparent gel.

12. The backlight module of claim 11, wherein a refractive index of the plurality of diffusion particles is different from a refractive index of the another transmission gel.

13. A liquid crystal display comprising a backlight module and a liquid crystal display panel disposed opposite to the backlight module, the backlight module providing a display light source to the liquid crystal display panel so that the liquid crystal display panel displays an image, wherein the backlight module comprises:
at least one light source; and
a light guide plate comprising:
a light incident surface formed at a proximal side surface of the light guide plate,
an accommodation through hole formed in the light guide plate proximate to the light incident surface, wherein the accommodation through hole has a substantially square cross-section and penetrates from a right side surface of the light guide plate to a left side surface of the light guide plate, and all longitudinal side surfaces thereof are enclosed by the light guide plate;
a light conversion element disposed within the accommodation through hole; and
a diffusion element disposed on the light incident surface to scatter light ray,
wherein the light source is placed facing the light incident surface of the light guide plate.

14. The liquid crystal display of claim 13, wherein the light conversion element comprises a transparent case and a plurality of Quantum Dots (QDs), and the plurality of QDs are encapsulated in the transparent case.

15. The liquid crystal display of claim 13, wherein the light conversion element comprises a transparent gel and a plurality of Quantum Dots (QDs), and the plurality of QDs are mixed in the transparent gel.

16. The liquid crystal display of claim 15, wherein the light guide plate further comprises a plurality of diffusion particles, and the plurality of diffusion particles are mixed in the transparent gel.

17. The liquid crystal display of claim 13, wherein the diffusion element comprises a plurality of diffusion particles and another transparent gel, and the plurality of diffusion particles are mixed in the another transparent gel.

18. The liquid crystal display of claim 17, wherein a refractive index of the plurality of diffusion particles is different from a refractive index of the another transmission gel.

* * * * *